United States Patent
Fujii et al.

(10) Patent No.: US 9,263,496 B2
(45) Date of Patent: Feb. 16, 2016

(54) METHOD OF MANUFACTURING AN IMAGE SENSOR BY JOINING A PIXEL CIRCUIT SUBSTRATE AND A LOGIC CIRCUIT SUBSTRATE AND THEREAFTER THINNING THE PIXEL CIRCUIT SUBSTRATE

(71) Applicant: Sony Corporation, Tokyo (JP)

(72) Inventors: Nobutoshi Fujii, Kanagawa (JP);
Kenichi Aoyagi, Kanagawa (JP);
Yoshiya Hagimoto, Kanagawa (JP);
Hayato Iwamoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/371,550

(22) PCT Filed: Jan. 8, 2013

(86) PCT No.: PCT/JP2013/050093
§ 371 (c)(1),
(2) Date: Jul. 10, 2014

(87) PCT Pub. No.: WO2013/108657
PCT Pub. Date: Jul. 25, 2013

(65) Prior Publication Data
US 2015/0004738 A1    Jan. 1, 2015

(30) Foreign Application Priority Data

Jan. 17, 2012  (JP) .................................. 2012-007086
Jan. 17, 2012  (JP) .................................. 2012-007087
Jan. 17, 2012  (JP) .................................. 2012-007088

(51) Int. Cl.
*H01L 21/00*    (2006.01)
*H01L 27/146*   (2006.01)
*H01L 25/00*    (2006.01)
*H01L 31/18*    (2006.01)
*H01L 25/065*   (2006.01)

(52) U.S. Cl.
CPC .......... *H01L 27/14689* (2013.01); *H01L 25/50* (2013.01); *H01L 27/1464* (2013.01); *H01L 27/1469* (2013.01); *H01L 27/14634* (2013.01); *H01L 27/14683* (2013.01); *H01L 31/1876* (2013.01); *H01L 25/0657* (2013.01); *H01L 2924/0002* (2013.01)

(58) Field of Classification Search
None
See application file for complete search history.

(56) References Cited

U.S. PATENT DOCUMENTS

2009/0033782 A1* 2/2009 Muroshima et al. .......... 348/308
2011/0316164 A1* 12/2011 Liao et al. ..................... 257/773

FOREIGN PATENT DOCUMENTS

| CN | 1606180 A | * 4/2005 |
|---|---|---|
| JP | 2005-285988 | 10/2005 |
| JP | 2005-322745 | 11/2005 |
| JP | 2007-234725 | 9/2007 |
| JP | 2011-096851 | 5/2011 |
| JP | 2012-009725 | 1/2012 |

* cited by examiner

*Primary Examiner* — Charles Garber
*Assistant Examiner* — Abdulfattah Mustapha
(74) *Attorney, Agent, or Firm* — Dentons US LLP

(57) ABSTRACT

The present technology includes: bonding a device formation side of a first substrate having a first device and a device formation side of a second substrate having a second device in opposition to each other; forming a protective film on at least an edge of the second substrate having the second device; and reducing a thickness of the first substrate.

15 Claims, 9 Drawing Sheets

METHOD OF MANUFACTURING AN IMAGE SENSOR BY JOINING A PIXEL CIRCUIT SUBSTRATE AND A LOGIC CIRCUIT SUBSTRATE AND THEREAFTER THINNING THE PIXEL CIRCUIT SUBSTRATE

TECHNICAL FIELD

The present disclosure relates to a method of manufacturing a semiconductor device having a structure for bonding a plurality of substrates.

BACKGROUND ART

High integration of a semiconductor device has been achieved by adoption of the fine process and improvement of the mounting density in a two-dimensional LSI (Large-Scale Integration). In recent years, however, physical limitations of the microfabrication have come within sight, and a three-dimensional LSI has drawn the attention.

In the three-dimensional LSI, a semiconductor device is formed in such a manner that substrates on which devices having various functions (for example, a memory device, a logic device, and an image sensor device) are formed are bonded with each other, and thereafter an upper-layer substrate is thinned down to a desired thickness using a grinding process (for example, see Japanese Unexamined Patent Application Publication No. 2011-96851 (PTL 1)).

CITATION LIST

Patent Literature

PTL 1: Japanese Unexamined Patent Application Publication No. 2011-96851

SUMMARY OF THE INVENTION

In the three-dimensional LSI, however, it is more likely that a lower-layer substrate will be damaged in reducing the thickness as described above. This is because an edge of an upper-layer substrate that is processed by the grinding in an acute-angled shape and that is called a knife edge as we say is unendurable against a stress to be exerted thereon, and cracking or peel-off occurs. Broken pieces of the knife edge that arise from this cracking or peel-off strike on the surface of the lower-layer substrate to damage wiring and the like that are formed on the lower-layer substrate. For such a reason, there has been an issue that the reliability and manufacturing yield of a semiconductor device could be deteriorated.

Accordingly, it is desirable to provide a method of manufacturing a semiconductor device that allows the reliability and manufacturing yield of a semiconductor device to be improved.

A first method of manufacturing a semiconductor device according to an embodiment of the present disclosure includes the following steps (A1) to (C1):
(A1) Bonding a device formation side of a first substrate having a first device and a device formation side of a second substrate having a second device in opposition to each other;
(B1) Forming a protective film on at least an edge of the second substrate having the second device; and
(C1) Reducing a thickness of the first substrate.

In the first method of manufacturing a semiconductor device according to an embodiment of the present disclosure, the protective film is formed at the edge of the lower-layer substrate (first substrate), and thereafter a thickness of the upper-layer substrate (second substrate) is reduced. Therefore, occurrence of a damage of the lower-layer substrate in reducing the thickness of the upper-layer substrate is reduced.

A second method of manufacturing a semiconductor device according to an embodiment of the present disclosure includes the following steps (A2) to (D2):
(A2) Forming a thinned portion at an edge of a first substrate having a first device;
(B2) Forming a protective film that absorbs no laser beams on at least an edge of a second substrate having a second device;
(C2) Bonding the second substrate and the first substrate with the second device and the first device opposed to each other; and
(D2) Selectively removing the thinned portion of the first substrate using a laser.

In the second method of manufacturing a semiconductor device according to an embodiment of the present disclosure, the protective film that absorbs no laser beams is formed at the edge of the lower-layer substrate (second substrate), the thinned portion is formed at the edge of the upper-layer substrate (first substrate), and the edge of the upper-layer substrate is removed. Therefore, occurrence of a damage of the lower-layer substrate in removing the edge of the upper-layer substrate is reduced.

A third method of manufacturing a semiconductor device according to an embodiment of the present disclosure includes the following steps (A3) to (C3):
(A3) Bonding a first substrate having a first device and a second substrate having a second device with the first device and the second device opposed to each other;
(B3) Reducing a thickness of an internal region excluding an edge of the first substrate; and
(C3) Removing the edge of the first substrate.

In the third method of manufacturing a semiconductor device according to an embodiment of the present disclosure, in a thinning process of the upper-layer substrate (first substrate), the internal region excluding the edge of the upper-layer substrate is reduced in thickness, and thereafter the edge of the upper-layer substrate is removed. Therefore, occurrence of a damage of the lower-layer substrate in removing the edge of the upper-layer substrate is reduced.

According to the first method of manufacturing a semiconductor device of an embodiment of the present disclosure, the protective film is formed at the edge of the lower-layer substrate, and thereafter a thickness of the upper-layer substrate is reduced. Therefore, it is possible to reduce the thickness of the upper-layer substrate without damaging the lower-layer substrate.

According to the second method of manufacturing a semiconductor device of an embodiment of the present disclosure, the protective film that absorbs no laser beams is formed at the edge of the lower-layer substrate, and the thinned portion is formed at the edge of the upper-layer substrate. Therefore, it is possible to remove the edge of the upper-layer substrate without damaging the lower-layer substrate.

According to the third method of manufacturing a semiconductor device of an embodiment of the present disclosure, the internal region excluding the edge of the upper-layer substrate is reduced in thickness, and thereafter the edge of the upper-layer substrate is removed. Therefore, it is possible to remove the edge of the upper-layer substrate without damaging the lower-layer substrate.

In the first to third methods of manufacturing a semiconductor device according to the above-described respective embodiments of the present disclosure, it is possible to improve the reliability and manufacturing yield of a semiconductor device.

EMBODIMENTS FOR CARRYING OUT THE INVENTION

Hereinafter, some embodiments of the present disclosure are described with reference to the drawings. It is to be noted that the descriptions are provided in the order given below.
1. Configuration of Image Pickup Device
2. First Embodiment (a method in which a protective film is formed on a lower-layer substrate, and thereafter a thinning process is carried out)
3. Second Embodiment (a method in which a lower-layer substrate is processed prior to bonding)
4. Third Embodiment (a method in which a thinned portion of an upper-layer substrate is removed using a laser)
5. Fourth Embodiment (a method in which a device formation region of an upper-layer substrate is reduced in thickness, and thereafter an edge of the upper-layer substrate is removed)
6. Application Examples (examples of an electronic apparatus)

1. Configuration of Image Pickup Device

Figure 1:
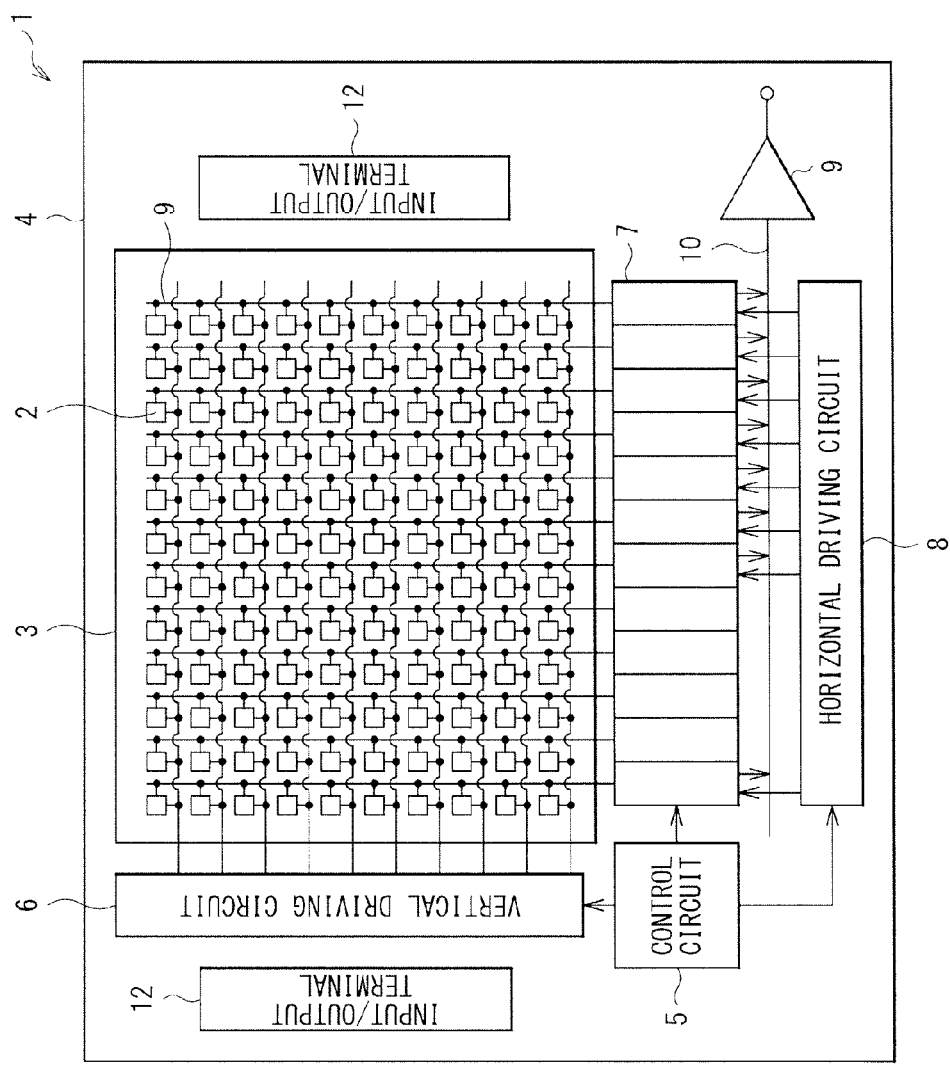
FIG. 1 is a schematic block diagram showing a configuration of an image pickup device according to any of first to fourth embodiments of the present disclosure.

FIG. 1 shows an overall configuration of a MOS solid-state image pickup device (image pickup device 1) to which a semiconductor device according to any of first to fourth embodiments of the present disclosure to be hereinafter described is applied. This image pickup device 1 is an image pickup device suitable for photographing color images (still images or moving images), and is configured of a pixel region 3 (so-called pixel array) and a peripheral region 4. The pixel region 3 is configured in such a manner that a plurality of pixels 2 each of which includes a photoelectric conversion section are arrayed in a matrix pattern on a substrate.

The pixel 2 that is provided at the pixel region 3 includes a photodiode PD that serves as the photoelectric conversion section, a plurality of pixel transistors Tr (MOS transistors), and the like. The plurality of pixel transistors Tr may be, for example, three types of transistors of a transfer transistor, a reset transistor, and an amplifying transistor, or may be alternatively configured of four types of transistors by adding a selection transistor. It is to be noted that an equivalent circuit of a unit pixel is similar to a typical equivalent circuit, and thus detailed description thereof is omitted. The pixel 2 is configurable as a single unit pixel. However, the pixel 2 may be configured in a pixel sharing structure. This pixel sharing structure is such that the plurality of photodiodes PD share a floating diffusion configuring the transfer transistor, and any of transistors other than the transfer transistor.

At the peripheral region 4, there are provided a control circuit 5, a vertical driving circuit 6, a column signal processing circuit 7, a horizontal driving circuit 8, an output circuit 9, and the like.

The control circuit 5 receives an input clock, and data commanding operation modes and the like, and outputs data such as internal information of the image pickup device 1. More specifically, this control circuit 5 generates a clock signal and a control signal that serve as reference signals for operation of the vertical driving circuit 6, the column signal processing circuit 7, the horizontal driving circuit 8, and the like on the basis of a vertical synchronization signal, a horizontal synchronization signal, and a master clock. Further, the control circuit 5 inputs these clock signal and control signal to the vertical driving circuit 6, the column signal processing circuit 7, the horizontal driving circuit 8, and the like.

The vertical driving circuit 6 may be configured of, for example, a shift register. This vertical driving circuit 6 selects a pixel drive wiring, and provides pulses for driving the pixels to the selected pixel drive wiring to drive the pixels on each row basis. More specifically, the vertical driving circuit 6 performs a selective scanning for each of the pixels 2 at the pixel region 3 sequentially in a vertical direction on each row basis, and provides a pixel signal based on a signal charge that is generated in accordance with the light-receiving amount in the photodiode PD on each of the pixels 2 to the column signal processing circuit 7 through a vertical signal line 9.

The column signal processing circuit 7 may be, for example, arranged for each column of the pixels 2, and performs signal processing operation such as noise rejection for signals to be output from the pixels 2 in a single row for each of the pixel columns. More specifically, the column signal processing circuit 7 carries out a signal processing operation such as CDS for rejecting a fixed pattern noise inherent in the pixel 2, signal amplification, and analog-to-digital conversion. At an output stage of this column signal processing circuit 7, a horizontal selection switch (not shown in the drawing) is provided to be connected between a horizontal signal line 10.

The horizontal driving circuit 8 may be configured of, for example, a shift register, and selects each of the column signal processing circuits 7 in order by outputting horizontal scan pulses sequentially to drive each of the column signal processing circuits 7 to output a pixel signal to the horizontal signal line 10.

The output circuit 9 performs a signal processing operation for signals to be provided sequentially from each of the column signal processing circuits 7 through the horizontal signal line 10 to output the resultant signals. In some cases, for example, this output circuit 9 may perform only buffering, or may perform black level adjustment, correction of column variations, various digital signal processing operations, and the like. Input/output terminals 12 deal with signal handling among external circuits.

Figure 2:
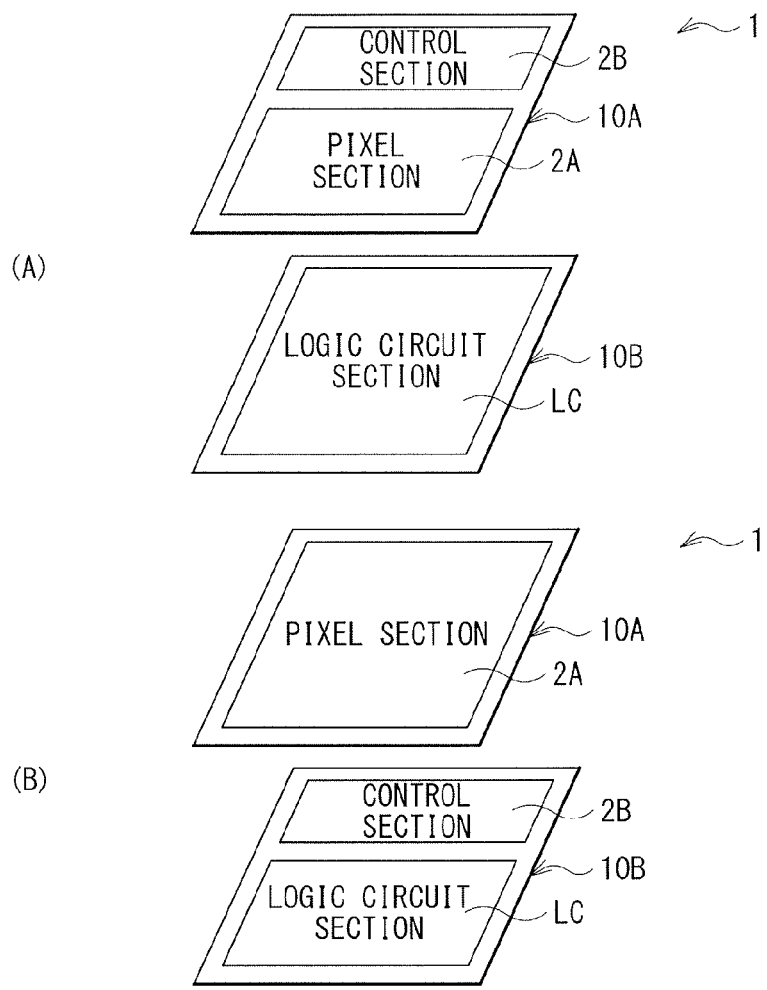
FIG. 2 is a simplified configuration diagram of the image pickup device illustrated in FIG. 1.
Figure 3:
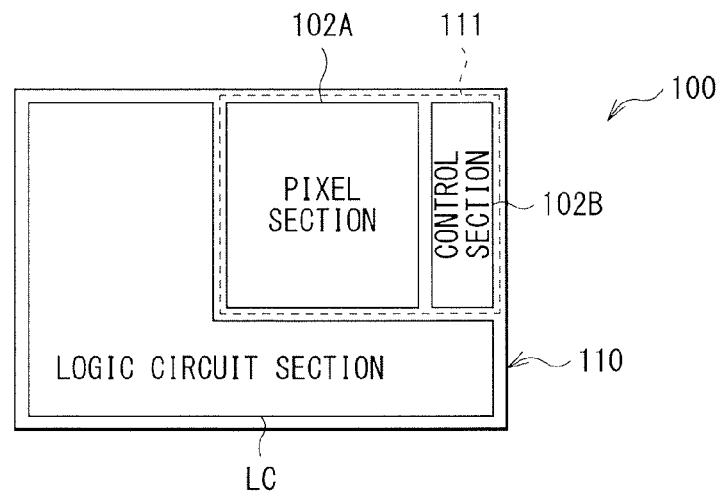
FIG. 3 is a simplified configuration diagram of an existing image pickup device.

Each of FIGS. 2 (A) and 2 (B) shows a simplified configuration of the image pickup device 1 to which a semiconductor device according to any of the first to fourth embodiments of the present disclosure is applied, and FIG. 3 shows a simplified configuration of an existing MOS solid-state image pickup device (image pickup device 100).

In the currently available image pickup device 100, as shown in FIG. 3, a pixel section 102A, a control section 102B, and a logic circuit LC for signal processing are formed in a single semiconductor substrate 110. Typically, an image sensor 110 is configured of a pixel region 113 and a control circuit 115.

On the contrary, in the image pickup device 1 to which a semiconductor device according to any of the first to fourth embodiments of the present disclosure is applied, as shown in FIG. 2 (A), a pixel section 2A, a control section 2B, and a logic circuit LC are formed on two separate substrates (for example, a first semiconductor substrate 10A and a second semiconductor substrate 10B). More specifically, the image pickup device 1 has a configuration in which the pixel section 2A and the control section 2B are formed on the first semiconductor substrate 10A, while the logic circuit LC including a signal processing circuit for performing the signal processing operation is formed on the second semiconductor substrate 10B, and the first semiconductor substrate 10A and the second semiconductor substrate 10B are electrically connected with each other.

It is to be noted that a combination of the pixel section 2A, the control section 2B, and the logic circuit LC that are formed separately on the first semiconductor substrate 10A and the second semiconductor substrate 10B is not limited specifically, and for example, as shown in FIG. 2 (B), the pixel section 2A may be formed on the first semiconductor substrate 10A, and the control section 2B and the logic circuit LC may be formed on the second semiconductor substrate 10B alternatively.

Figure 4:
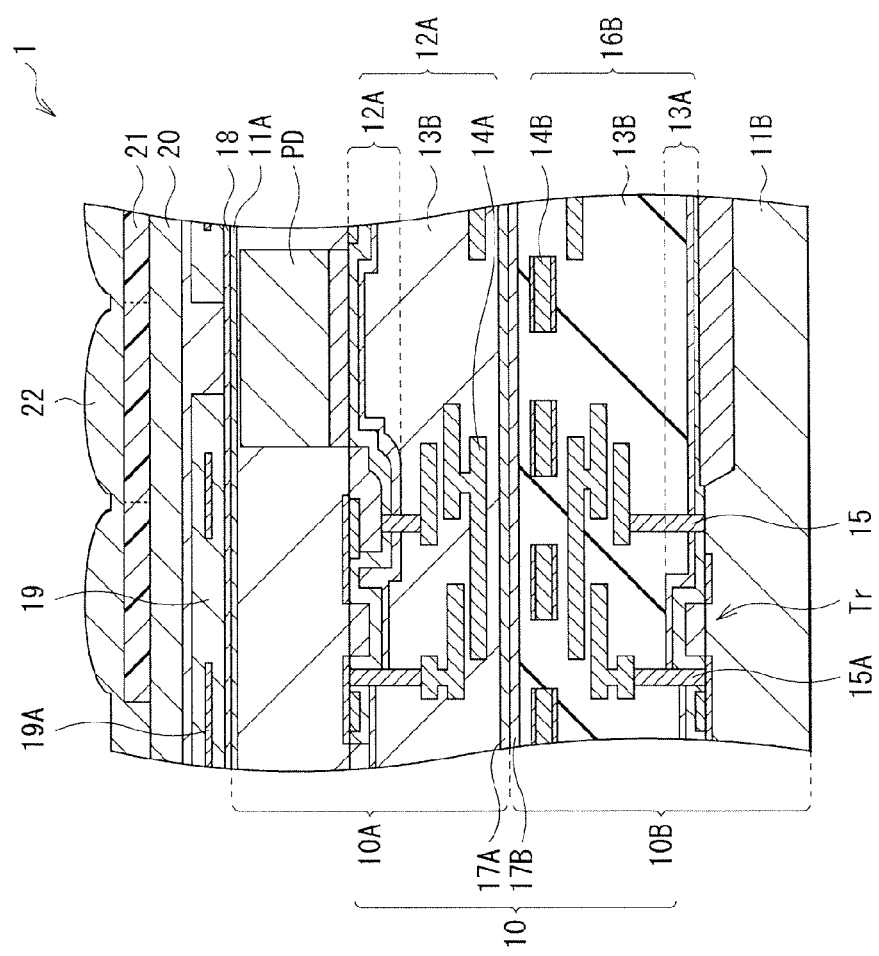
FIG. 4 is a cross-sectional view of the image pickup device illustrated in FIG. 1.

FIG. 4 shows a part of a cross-sectional configuration of the image pickup device 1 on the basis of the configuration illustrated in FIG. 2 (A). In this image pickup device 1, the first semiconductor substrate 10A on which the pixel section 102A and the control section 102B are formed and the second semiconductor substrate 10B on which the logic circuit LC is formed are stacked vertically with electrically connected with each other.

More specifically, this image pickup device 1 is configured (layered product 10, see FIG. 4) to stack the first semiconductor substrate 10A and the second semiconductor substrate 10B with the second semiconductor substrate 10B placed on the downside by bonding device formation sides (device layers 16A and 16B) on which the MOS transistors Tr are formed on the second semiconductor substrate 10B and the first semiconductor substrate 10A in opposition to each other. In this image pickup device 1, the photodiode PD that serves as the photoelectric conversion section is arranged on the side of a surface (topside surface in the drawing, and hereinafter referred to as a backside) on the first semiconductor substrate 10A side. On junction surfaces of the first semiconductor substrate 10A and the second semiconductor substrate 10B, insulating layers 13A and 13B are formed on which multi-layer wiring layers 14A and 14B are formed, respectively.

It is to be noted that each of the MOS transistors Tr that are provided on the pixel section 2A and the control section 2B in the pixel region 3 has a configuration in which a gate electrode is formed on a pair of a source electrode and a drain electrode with a gate insulating film in between (these component parts are not shown in the drawing). Further, on the backside of the first semiconductor substrate 10A, for example, an antireflective film 18, an insulating film 19 including a light-blocking film 19A, and a planarizing film 20 may be formed. At a position corresponding to the photodiode PD on each of the pixels 2 on the planarizing film 20, an on-chip lens 22 is provided with a color filter in between.

In the image pickup device 1 having such a configuration, the photodiode PD is irradiated with light via the on-chip lens from the backside of the first semiconductor substrate 10A, and a signal charge is generated for each of the pixels 2. It is possible to obtain image data by reading image signals in all of the pixels 2 as voltage signals corresponding to the amount of such a signal charge, for example. Hereinafter, the description is provided on an example of a method of manufacturing the image pickup device 1.

(Manufacturing Method)
(Fabrication of First Semiconductor Substrate (First Substrate) 10A)

First, an image sensor, that is, the pixel section 2A and the control section 2B are formed in a device formation region on a substrate 11A. More specifically, in the pixel section 2A, for example, the photodiode PD that serves as the photoelectric conversion section in each of the pixels 2 is formed on the substrate 11A, and thereafter each of the pixel transistors Tr is formed. Here, a pixel transistor Tr adjacent to the photodiode PD corresponds to the transfer transistor, and a source-drain region thereof (not shown in the drawing) corresponds to a floating diffusion FD. Further, the MOS transistors Tr are formed in the control section 2B. Each of the MOS transistors Tr may be configured of, for example, a pair of n-type source/drain region, and the gate electrode that is formed with the gate insulating film in between (these component parts are not shown in the drawing).

Next, after the insulating film 13A is formed on the substrate 11A, connection holes 15A are formed, and connecting conductors 15 to be connected with a predetermined transistor are formed. Subsequently, a metallic layer that may be configured of multi-layered, for example, three-layer copper and the like is formed as a wiring layer 14A to connect each of the connecting conductors 15. The steps described thus far form the first semiconductor substrate 10A having the pixel section 2A and the control section 2B thereon.

(Fabrication of Second Semiconductor Substrate (Second Substrate) 10B)

Next, the logic circuit LC including the column signal processing circuit 7 and the like for the signal processing purpose is formed in a device formation region on a substrate 11B. More specifically, for example, the plurality of MOS transistors Tr configuring the logic circuit LC are formed on the substrate 11B. Each of the MOS transistors Tr may be configured of, for example, a pair of n-type source/drain region, and the gate electrode that is formed with the gate insulating film in between (these component parts are not shown in the drawing).

Subsequently, in the same manner as is the case in the above-described first semiconductor substrate 10A, the insulating layer 13B, the connection holes 15A, the connecting conductors 15, and a wiring layer 14B are formed on the substrate 11B. The steps described thus far form the second semiconductor substrate 10B having the logic circuit LC thereon. It is to be noted that, on top of the wiring layer 14B, a stress correction film (not shown in the drawing) may be formed for alleviating a stress at the time of bonding of the first semiconductor substrate 10A and the second semiconductor substrate 10B to be hereinafter described. The stress correction film may be configured in such a manner that, for example, a P—SiN film (plasma nitride film) or a P—SiON film (plasma oxynitride film) may be formed in a film thickness within a range of about 100 to 200 nm, for example.

(Bonding of First Semiconductor Substrate 10A and Second Semiconductor Substrate 10B)

Next, the first semiconductor substrate 10A and the second semiconductor substrate 10B are bonded with the wiring layers 14A and 14B opposed to each other. More specifically, for example, an adhesive material layer (not shown in the drawing) may be formed on one side of a junction surface of the first semiconductor substrate 10A or the second semiconductor substrate 10B, and the first semiconductor substrate 10A and the second semiconductor substrate 10B are bonded with this adhesive material layer in between. Here, the bonding is performed with the first semiconductor substrate 10A on which the pixel region 3 is formed placed on an upper layer and with the second semiconductor substrate 10B placed on a lower layer.

It is to be noted that, for the bonding of the first semiconductor substrate 10A and the second semiconductor substrate 10B, plasma bonding may be used apart from the bonding by the use of the above-described adhesive material layer. In a case of the use of the plasma bonding, plasma $SiO_2$, SiN, SiC, or SiCN films, and the like are formed on each of the junction surfaces of the first semiconductor substrate 10A and the second semiconductor substrate 10B. The first semiconductor substrate 10A and the second semiconductor substrate 10B are bonded with each other in such a manner that a plasma treatment is performed for each of the junction surfaces on which these films are formed to be overlapped with each other, and thereafter an annealing treatment is performed for the overlapped junction surfaces. Here, the annealing treatment may be preferably carried out in a low-temperature process at temperature of 400 degrees centigrade or less that has no influence on the wiring and the like.

(Reduction of Thickness of First Semiconductor Substrate 10A)

Subsequently, the backside (the substrate 11A side) of the first semiconductor substrate 10A is ground and polished to reduce a thickness of the first semiconductor substrate 10A. More specifically, such a reduction in thickness is carried out in such a manner that the substrate 11A having a thickness of about 600 μm, for example, may be reduced down to a thickness within a range of about 3 to 6 μm to face the photodiodes PD with one another. By reducing the thickness of the first semiconductor substrate 10A, the backside of the first semiconductor substrate 10A serves as a light incidence surface in the image pickup device 1 of a backside illumination type.

Finally, the antireflective film 18, the insulating film 19 including the light-blocking film 19A, and the planarizing film 20 are formed on the backside of the first semiconductor substrate 10A. Further, the color filters 21 of red (R), green (G), and blue (B) corresponding to each of the pixels, and the on-chip lens 22 are formed on this planarizing film 20, thereby bringing the image pickup device 1 to completion.

Hereinafter, as the methods of manufacturing a semiconductor device according to the first to fourth embodiments of the present disclosure, the description is provided on a method of reducing a thickness of the first semiconductor substrate 10A. It is to be noted that any component parts essentially same as those of the above-described image pickup device 1 are denoted with the same reference numerals, and the related descriptions are omitted as appropriate.

2. First Embodiment

Figure 5A:
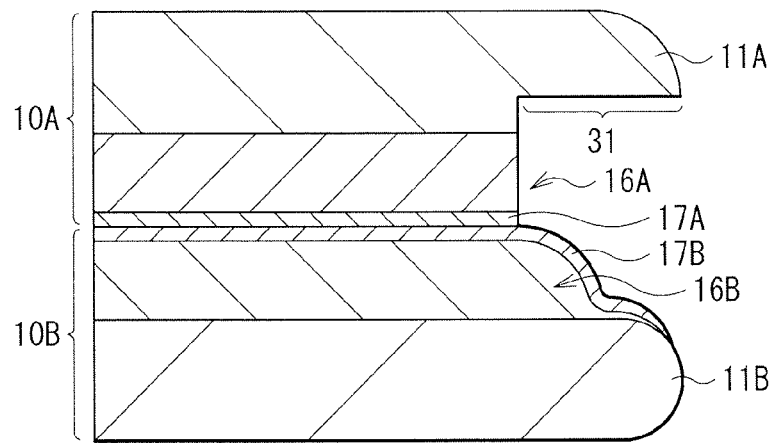
FIG. 5A is a schematic process diagram showing a method of manufacturing a semiconductor device according to a first embodiment of the present disclosure.
Figure 5B:
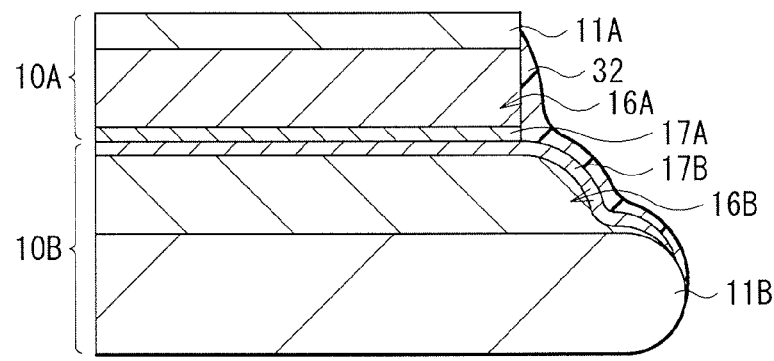
FIG. 5B is a schematic process diagram showing a process following on the process shown in FIG. 5A.
Figure 5C:
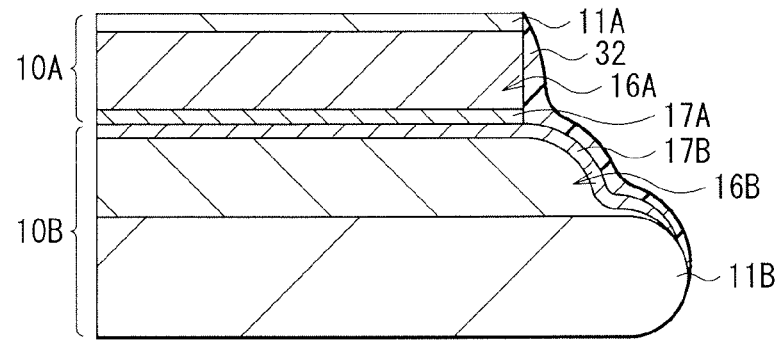
FIG. 5C is a schematic process diagram showing a process following on the process shown in FIG. 5B.

Each of FIG. 5A to FIG. 5C shows a method of manufacturing a semiconductor device according to a first embodiment of the present disclosure, in particular, a process of reducing a thickness of the first semiconductor substrate 10A.

In this embodiment, in the beginning, as shown in FIG. 5A, an edge of the first semiconductor substrate 10A is removed in a range of, for example, a width of 2 mm and a depth of 100 μm to form a thinned portion 31. Next, the first semiconductor substrate 10A and the second semiconductor substrate 10B are bonded with each other using, for example, the above-described plasma bonding or other methods.

Subsequently, as shown in FIG. 5B, the first semiconductor substrate 10A is ground to reduce the thickness of the whole surface of the substrate in a mechanical manner, and thereafter an SiN film (protective film 32) with a film thickness of 3 μm, for example, is formed on the side surface of the first semiconductor substrate 10A and on the surface of the second semiconductor substrate 10B using, for example, an ion beam method (see Japanese Unexamined Patent Application Publication No. 2010-70788). In the event that broken pieces of the substrate 11A stick on the surface of the second semiconductor substrate 10B at the time of grinding of the first semiconductor substrate 10A, this protective film 32 serves to cover the surface of the second semiconductor substrate 10B including these broken pieces.

As a constituent material for this protective film 32, the use of a material may be preferable that has resistance to chemical liquid (for example, acid-based chemical liquid) that is used in a chemical liquid treatment for the backside of the first semiconductor substrate 10A to be performed later. Specific examples of the material may include plasma SiN, SiC, and SiCN films, and the like.

Thereafter, as shown in FIG. 5C, the surface of the substrate 11A is smoothed and further reduced in thickness using the chemical liquid treatment. On this occasion, when the protective film 32 is not formed at an edge of the second semiconductor substrate 10B, there will be a concern about a possibility that chemical solution could be immersed into a portion damaged by the substrate 11A to cause elution of a metallic material to be used for configuring the wiring layer 14B that is formed at the edge of the second semiconductor substrate 10B, resulting in occurrence of contamination. On the other hand, in this embodiment, after an edge (thinned portion 31) of the first semiconductor substrate 10A is removed, the protective film 32 is formed on the surface of the second semiconductor substrate 10B, and thus a damaged portion arising from collision of broken pieces is sealed by the protective film 32. This prevents metallic contamination that may be caused by elution of the wiring layer 14B.

Figure 6A:
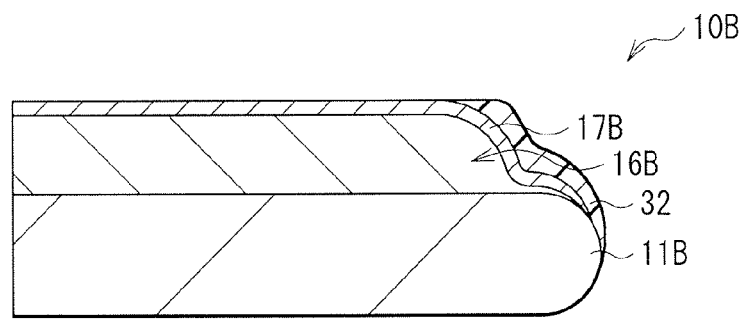
FIG. 6A is a schematic process diagram showing another example of the method of manufacturing a semiconductor device according to the first embodiment of the present disclosure.
Figure 6B:
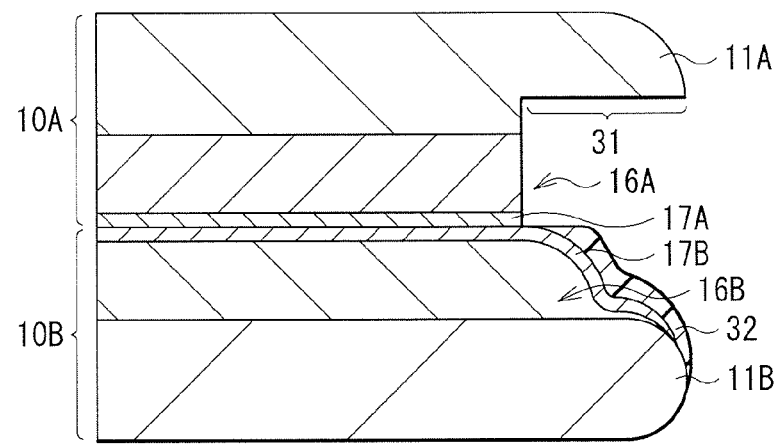
FIG. 6B is a schematic process diagram showing a process following on the process shown in FIG. 6A.
Figure 6C:
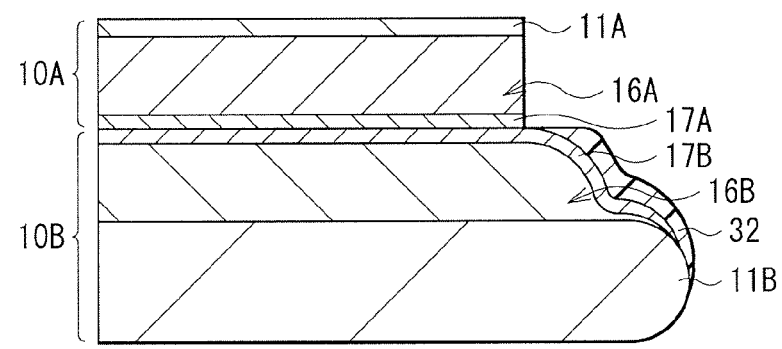
FIG. 6C is a schematic process diagram showing a process following on the process shown in FIG. 6B.

It is to be noted that, in this embodiment, the protective film 32 is formed after the thinned portion 31 of the first semiconductor substrate 10A is removed and the whole surface of the substrate 11A is reduced in thickness. However, as shown in FIG. 6A, the protective film 32 according to this embodiment may be alternatively formed at the edge of the second semiconductor substrate 10B prior to the bonding of the first semiconductor substrate 10A and the second semiconductor substrate 10B. Following the formation of the protective film 32, as shown in FIG. 6B and FIG. 6C, formation of the thinned portion 31 at the edge of the first semiconductor substrate 10A, grinding and thinning of the substrate 11A, as well as removal of the thinned portion 31 are carried out. Further, a method of forming the protective film 32 is not limited specifically so long as such a method allows the protective film 32 to be formed locally at the edge of the second semiconductor substrate 10B. An example of such a method may include a chemical vapor phase film-forming method that blows local plasma and film-forming gas to the edge. As an alternative, a method of using a coater capable of performing a film formation only within a predetermined range by injecting a coating film liquid from a narrow nozzle, and a method of forming the protective film only at the edge in such a manner that coating liquid or photoresist is coated over the whole surface, and thereafter lithographic exposure and removal of resist are performed may be used.

In a currently-available thinning process, a grinder process is carried out in the beginning. In grinding an upper-layer substrate using this grinder process, because this is a mechanical grinding, there is a concern about a possibility that cracking or peel-off will occur at an edge of the upper-layer substrate as previously described. This cracking or peel-off of the upper-layer substrate strikes directly on an edge of a lower-layer substrate as broken pieces to cause damage to the surface of the lower-layer substrate. When the wiring layer is formed on such a damaged portion, wires are exposed, and contamination may occur that is caused by elution of metals to be used for configuring wires in a thinning process using a wet etching and the like to be performed subsequently. Also, even when the wiring layer is not formed on the lower-layer substrate, damage arising on the lower-layer substrate may cause dust generation, and this will pose an issue of deterioration in the manufacturing yield.

As a method of solving such an issue, for example, Japanese Unexamined Patent Application Publication No. 2003-15193 has disclosed a method in which grinding on the side of an SOI that serves as an active silicon layer is interrupted halfway, and a substrate is removed as deep as a predetermined thickness using a chemical liquid treatment. By the use of this method, the edge of the upper-layer substrate is also removed in further thinning the upper-layer substrate using the chemical liquid treatment.

However, this method presupposes that edges of the upper-layer substrate and the lower-layer substrate that are stacked vertically are bonded with each other, and that an insulating film and the like on the upper-layer substrate side that remain behind at the edge are removable with chemical liquid to be used in removing the upper-layer substrate. In a case of a stacked three-dimensional semiconductor device, a step is made at an edge in fabricating a device, and thus edges are typically put in an unbonded state. Further, since an SiN film serving as an insulating film that is formed on each layer of the device is not removable with chemical liquid, this method has no function other than only generation of a dust source at the edge.

On the contrary, in this embodiment, prior to a thinning process of the upper-layer first semiconductor substrate 10A using a chemical liquid treatment, the protective film 32 is formed at the edge of the second semiconductor substrate 10B. By forming this protective film 32, a damaged portion of the second semiconductor substrate 10B that may be produced due to direct striking of broken pieces arising from the substrate 11A in mechanical grinding of the first semiconductor substrate 10A is covered, and etching of the second semiconductor substrate 10B that may be caused by the chemical liquid treatment to be performed subsequently is prevented. Therefore, this prevents contamination due to metal elution or dust generation from a damaged portion of the second semiconductor substrate 10B.

As described above, according to the method of manufacturing a semiconductor device of this embodiment of the present disclosure, prior to the thinning process of the upper-layer first semiconductor substrate 10A using the chemical liquid treatment, the protective film 32 is formed at the edge of the second semiconductor substrate 10B that may possibly get a direct striking of broken pieces arising from the substrate 11A in the thinning process of the first semiconductor substrate 10A. This prevents etching of the second semiconductor substrate 10B that may be caused by the chemical liquid. Therefore, this prevents contamination due to metal elution or dust generation from the second semiconductor substrate 10B side, and makes it possible to improve the reliability and manufacturing yield of a semiconductor device.

Further, in the method of manufacturing a semiconductor device according to this embodiment of the present disclosure, the protective film 32 is formed only at a desired portion of the second semiconductor substrate 10B, and thus warpage of the second semiconductor substrate 10B that may be caused by a stress of the protective film is suppressed, and handling is made easy as compared with a case where the protective film is formed over a whole surface of the second semiconductor substrate 10B.

3. Second Embodiment

Each of FIG. 7A to FIG. 7D shows a method of manufacturing a semiconductor device according to a second embodiment of the present disclosure, in particular, a process of reducing a thickness of the first semiconductor substrate. The manufacturing method in this embodiment of the present disclosure is different from the method according to the above-described embodiment in that prior to the bonding of the first semiconductor substrate 10A and the second semiconductor substrate 10B, a thinned portion 33 is formed at an edge of the second semiconductor substrate 10B, more specifically, at a region on which a wiring layer is formed, and a protective film 34 is formed over a whole surface thereof.

Figure 7A:
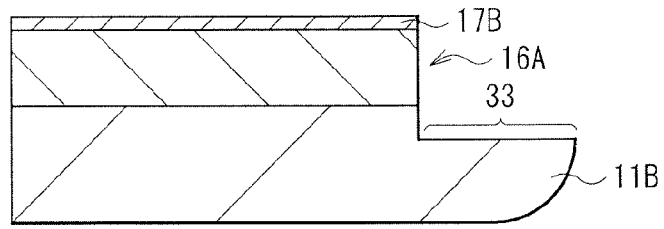
FIG. 7A is a schematic process diagram showing a method of manufacturing a semiconductor device according to a second embodiment of the present disclosure.

First, the second semiconductor substrate 10B is formed, and thereafter as shown in FIG. 7A, an edge where the wiring layer 14 of the second semiconductor substrate 10B is formed is reduced in thickness using a trimming process to form the thinned portion 33. It is to be noted that, as a method of forming the thinned portion 33, any method other than the trimming process may be used alternatively. For example, a method of applying a polishing process only for a predetermined range (the edge in this case), or an etching process method using a dry or wet process may be used.

Figure 7B:
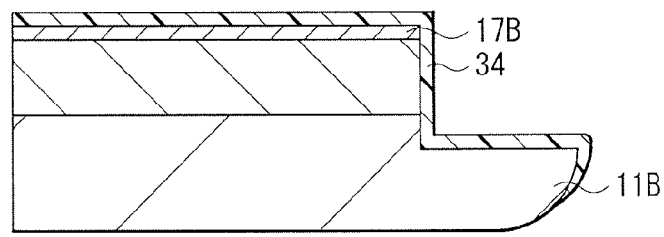
FIG. 7B is a schematic process diagram showing a process following on the process shown in FIG. 7A.
Figure 7C:
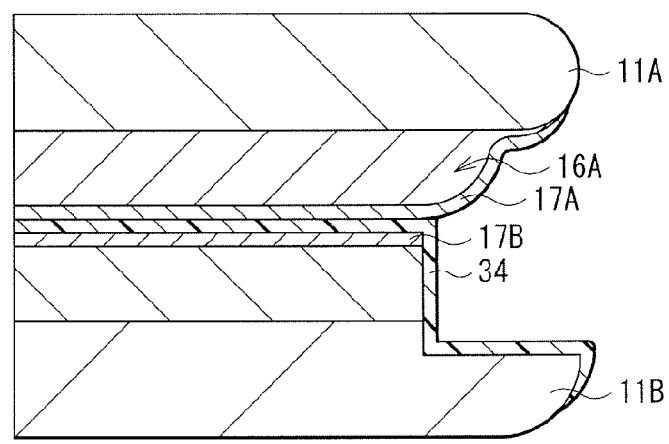
FIG. 7C is a schematic process diagram showing a process following on the process shown in FIG. 7B.
Figure 7D:
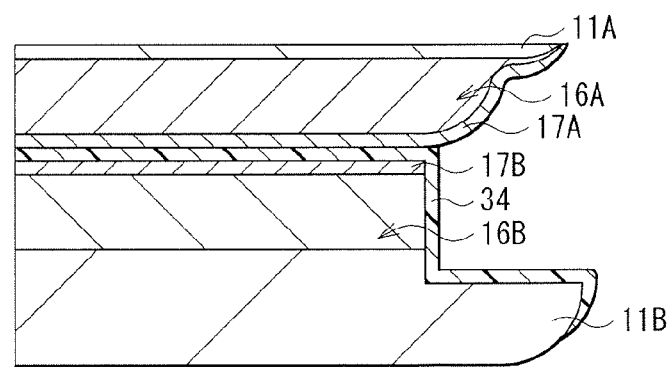
FIG. 7D is a schematic process diagram showing a process following on the process shown in FIG. 7C.

Next, as shown in FIG. 7B, the protective film 34 is formed over the whole surface of the second semiconductor substrate 10B, more specifically, on the side surface and the surface of the thinned portion that are exposed by the removal of a device formation surface. This protective film 34 is formed with a thickness of 10 μm, for example, using a material similar to that used for the protective film 32 which is formed in the above-described first embodiment, that is, any of plasma SiN, SiC, SiCN films and the like which are materials having resistance to the chemical liquid, such as acid-based chemical liquid (fluonitric acid-based wet etching liquid), for example, which is used for reducing the thickness of the first semiconductor substrate 10A. It is to be noted that, as a method of forming the protective film 34, because the top surface, that is, the device formation surface of the second semiconductor substrate 10B after the film-forming process is completed becomes a bonding surface, the protective film 34 may be preferably formed uniformly to avoid an adverse influence on the bonding. More specifically, the use of an ALD (Atomic Layer Deposition) method that is excellent in the film thickness controllability may be preferable. Alternatively, a CVD (Chemical Vapor Deposition) method may be used. When the CVD method and the like are to be used, the surface flatness may be preferably improved by the use of a CMP method and the like after a film-forming process is completed.

Further, prior to the formation of the protective film 34, the surface of the second semiconductor substrate 10B may be preferably smoothed and cleaned using a wet process. More specifically, metal-based impurities to be attached when using the scrubber cleaning for removing dust on the surface of the second semiconductor substrate 10B, or using a machining process like a trimming process are removed. In concrete terms, it is supposed to carry out a cleaning process using acid-based chemical liquid (for example, hydrofluoric acid hydrogen peroxide mixed solution (FPM)). This improves the adhesiveness of the protective film 34 to the second semiconductor substrate 10B and the film-forming performance of the protective film 34, as well as a protective capability against the chemical liquid to be used in reducing the thickness of the first semiconductor substrate 10A.

As described above, in this embodiment of the present disclosure, the first semiconductor substrate 10A and the second semiconductor substrate 10B are bonded with each other after the thinned portion 33 is formed at the edge of the second semiconductor substrate 10B, and the protective film is formed to cover this thinned portion 33. Subsequently, the first semiconductor substrate 10A is reduced in thickness. As a result, as with the above-described first embodiment, it is possible to prevent occurrence of contamination due to metal elution and dust generation at the edge of the second semiconductor substrate 10B at the time of reducing the thickness using the chemical liquid treatment.

4. Third Embodiment

Figure 8A:
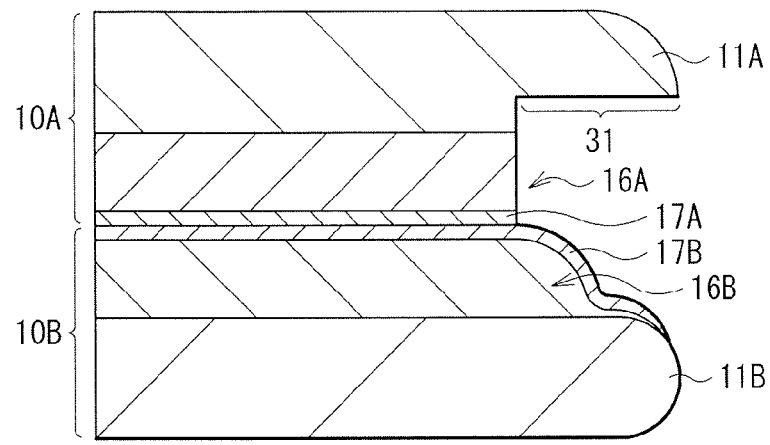
FIG. 8A is a schematic process diagram showing a method of manufacturing a semiconductor device according to a third embodiment of the present disclosure.
Figure 8B:
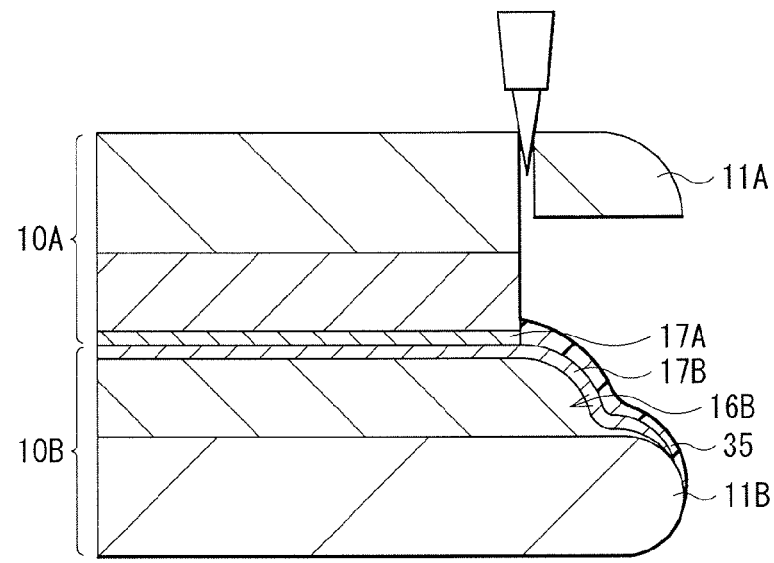
FIG. 8B is a schematic process diagram showing a process following on the process shown in FIG. 8A.
Figure 8C:
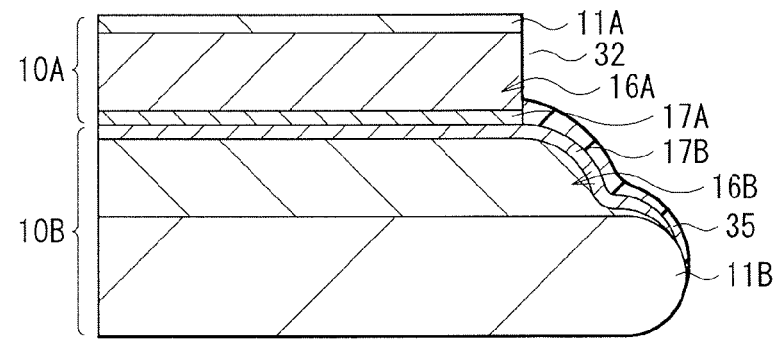
FIG. 8C is a schematic process diagram showing a process following on the process shown in FIG. 8B.

Each of FIG. 8A to FIG. 8C shows a method of manufacturing a semiconductor device according to a third embodiment of the present disclosure, in particular, a process of reducing a thickness of the first semiconductor substrate 10A. The manufacturing method in this embodiment of the present disclosure uses a laser microjet for removing an edge (thinned portion 31) of the first semiconductor substrate 10A.

First, as shown in FIG. 8A, an edge of the first semiconductor substrate 10A is removed in a range of, for example, a width of 2 mm and a depth of 100 μm to form the thinned portion 31. The use of the laser microjet for removal of this thinned portion 31 in conjunction with the formation of the thinned portion 31 makes it possible to suppress occurrence of damage in the second semiconductor substrate 10B. More specifically, a void is provided between the first semiconductor substrate 10A and the second semiconductor substrate 10B by providing the thinned portion 31 between the first semiconductor substrate 10A and the second semiconductor substrate 10B. Further, the laser microjet that propagates water generates strongly spreading radiation flux once a laser wavelength runs through the first semiconductor substrate 10A, and becomes unable to keep a strong energy obtained by reflecting laser beams. As a result, it is possible to suppress damage of the second semiconductor substrate 10B that is caused by the laser.

Next, as shown in FIG. 8B, a protective film 35 is formed at the edge of the second semiconductor substrate 10B. This protective film 35 is formed with a thickness of 1 μm using a material that absorbs no laser beams, more specifically, $SiO_2$ or SiN film, and the like. As a result, a process selection ratio at the time of a process for removing the thinned portion 31 of the first semiconductor substrate 10A using the laser microjet to be carried out in the subsequent process is assured, and damage of the second semiconductor substrate 10B that is caused by the laser beams is prevented by virtue of the combined effect obtained by forming the above-described void.

Subsequently, the first semiconductor substrate 10A and the second semiconductor substrate 10B are bonded with each other using the aforementioned plasma bonding and the like, and thereafter the whole backside of the first semiconductor substrate 10A is reduced in thickness using the chemical liquid treatment.

As a currently-available method of removing an edge of an upper-layer substrate, as with this embodiment, a method of using laser beams has been disclosed (for example, see Japanese Unexamined Patent Application Publication No. 2006-108532). More specifically, for a stacked upper-layer substrate, a predetermined position thereof is irradiated with laser beams to remove an edge of the upper-layer substrate, and thereafter the upper-layer substrate is ground to reduce the thickness thereof. In this method, because the edge of the upper-layer substrate is removed prior to grinding of the upper-layer substrate, a knife edge is not formed. Therefore, it is possible to grind the upper-layer substrate in a predetermined thickness without causing damage to the surface of a lower-layer substrate at the time of grinding. However, typically a process by the use of laser beams has no selection ratio, and thus damage of the lower-layer substrate occurs at the same time that the edge of the upper-layer substrate is removed. As a result, as is the case in a currently-available thinning process, contamination due to metal elution or dust generation may occur. Further, a laser beam has a short focal length, and thus it may be technically difficult to process the upper-layer substrate without any change. Even if the upper-layer substrate is allowed to be processed, the upper-layer substrate has to be processed ten times or more while focusing laser beams.

On the contrary, in this embodiment, after the thinned portion 31 is formed at the edge of the first semiconductor substrate 10A, and the protective film 35 that absorbs no laser wavelength is provided at the edge of the second semiconductor substrate 10B, the edge of the first semiconductor substrate 10A is removed using laser beams. This makes it possible to perform the process without causing damage to the second semiconductor substrate 10B due to the laser beams.

It is to be noted that here the protective film 35 against the laser beams is formed only at the edge of the second semiconductor substrate 10B, however, a method of forming the protective film 35 is not limited thereto. As an alternative, the protective film 35 may be provided over the whole surface of the second semiconductor substrate 10B prior to the bonding of the first semiconductor substrate 10A and the second semiconductor substrate 10B.

5. Fourth Embodiment

Figure 9A:
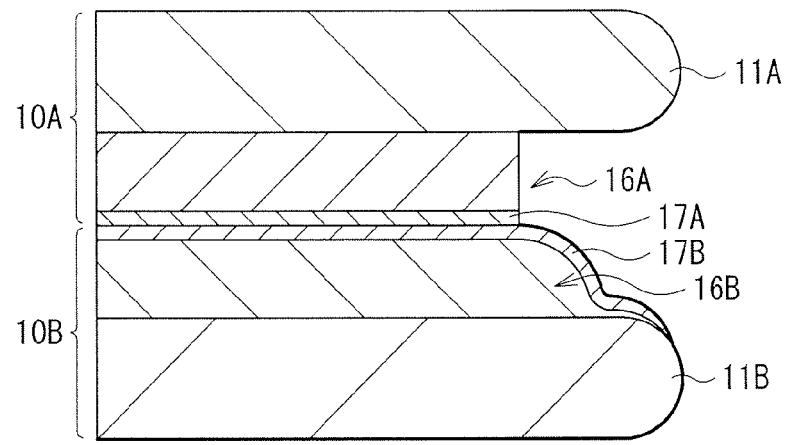
FIG. 9A is a schematic process diagram showing a method of manufacturing a semiconductor device according to a fourth embodiment of the present disclosure.
Figure 9B:
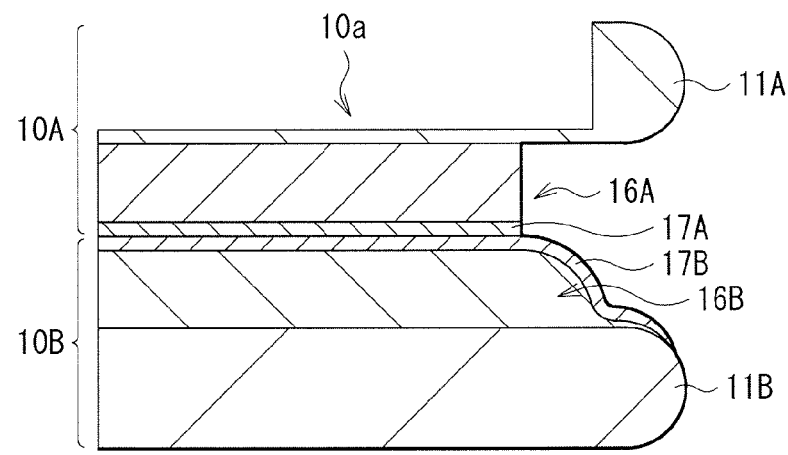
FIG. 9B is a schematic process diagram showing a process following on the process shown in FIG. 9A.
Figure 9C:
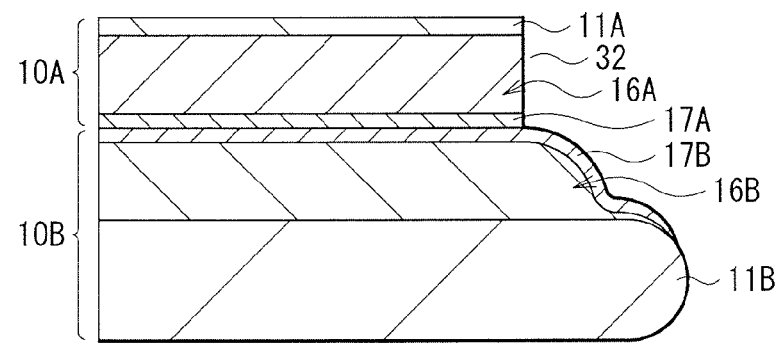
FIG. 9C is a schematic process diagram showing a process following on the process shown in FIG. 9B.

Each of FIG. 9A to FIG. 9C shows a method of manufacturing a semiconductor device according to a fourth embodiment of the present disclosure, in particular, a process of reducing a thickness of the first semiconductor substrate 10A. The manufacturing method in this embodiment of the present disclosure grinds an internal region 10a in which an edge is left as it is on the backside of the first semiconductor substrate 10A to reduce it as deep as a predetermined thickness, and thereafter the edge is removed.

First, as shown in FIG. 9A, the first semiconductor substrate 10A and the second semiconductor substrate 10B are bonded with each other using the aforementioned plasma bonding and the like. Subsequently, as shown in FIG. 9B, the edge of the first semiconductor substrate 10A that may cause damage to the surface of the second semiconductor substrate 10B is left as it is, and the internal region 10a in which devices such as the MOS transistors Tr are formed is ground. Afterward, the internal region 10a is thinned as deep as a predetermined film thickness using a wet etching method.

Next, as shown in FIG. 9C, the edge of the first semiconductor substrate 10A is removed using an edge trimming method.

It is to be noted that before or after the bonding of the first semiconductor substrate 10A and the second semiconductor substrate 10B, as with the above-described first to third embodiments, a protective film such as an SiN film may be provided over the whole surface or at the edge of the second semiconductor substrate 10B. Such a manner makes it possible to suppress mechanical damage of the surface of the second semiconductor substrate 10B that may be caused by broken pieces in removing the edge of the first semiconductor substrate 10A.

As a currently-available method of removing an edge of an upper-layer substrate after the bonding of the upper-layer substrate and a lower-layer substrate, there is, for example, a method disclosed in Japanese Unexamined Patent Application Publication No. 2008-84976 in addition to the removal method disclosed in the aforementioned Patent Gazette (Japanese Unexamined Patent Application Publication No. 2011-96851, and the like). More specifically, a circular convex portion is formed at a peripheral region surrounding a device formation region by performing a grinding process by the use of a first grind stone, and thereafter a whole backside of an upper-layer substrate including the circular convex portion is ground to be flattened using a second grind stone with an abrasive grain diameter smaller than that of the first grind stone. Although this method makes it possible to prevent the upper-layer substrate from being processed like a knife edge, it may be difficult to avoid occurrence of damage of the lower-layer substrate that may be caused by direct striking of broken pieces of the upper-layer substrate in a second grinding process. As a result, metal elution due to a subsequent chemical liquid treatment or contamination due to dust generation may occur.

On the contrary, in this embodiment, in a thinning process of the first semiconductor substrate 10A, the edge is left as it is, and the internal region in which devices are formed is mechanically ground. Subsequently, the substrate 11A is further thinned as deep as a predetermined thickness with the edge left as it is by performing a chemical treatment using chemical liquid, and thereafter the edge of the first semiconductor substrate 10A is removed using the edge trimming method. By going through such a process, it is possible to prevent metal elution due to a subsequent chemical liquid treatment or contamination due to dust generation.

6. Application Examples

Figure 10:
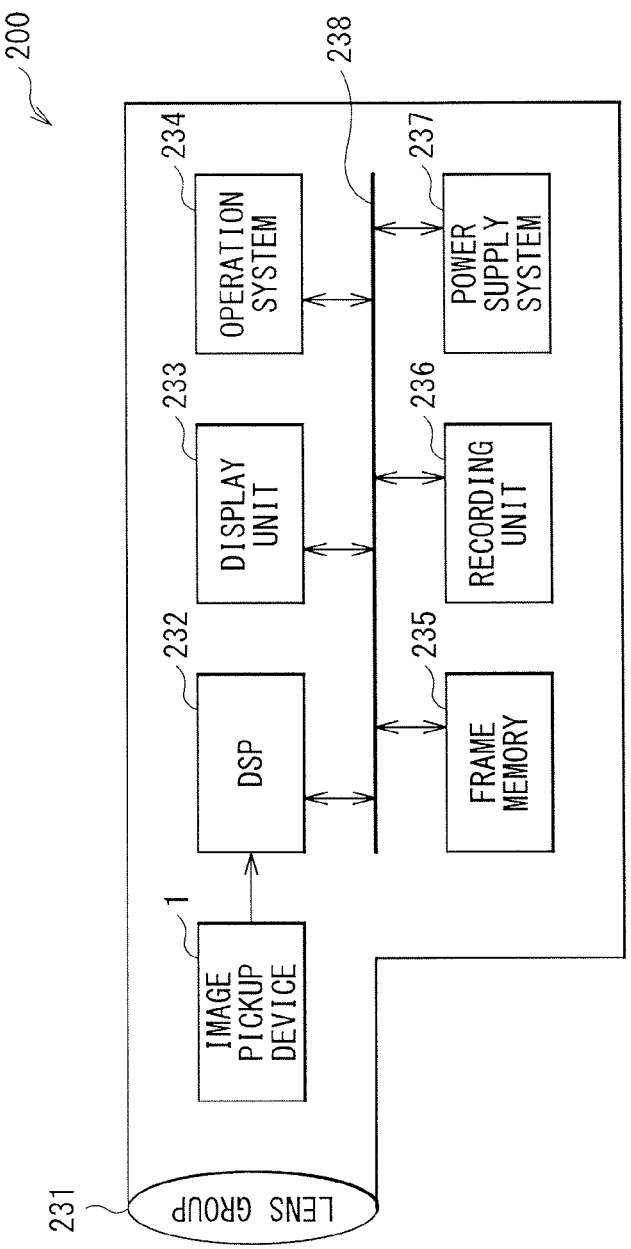
FIG. 10 is a schematic block diagram of an electronic apparatus (camera) according to an application example.

The image pickup device 1 including a semiconductor device that is formed using any of the manufacturing methods described in the aforementioned first to fourth embodiments is applicable to various types of electronic apparatuses having photographing functions, measuring functions, display functions, and the like. As described above, the image pickup device 1 is capable of providing high-quality color images, and thus it is preferred for mobile apparatuses, such as a camera (digital still camera or video camera), or a mobile phone and a PDA (Personal Digital Assistant) having photographing functions. In addition, the image pickup device 1 is also applicable to a specific substance measuring (detecting) apparatus, and the like. As an example, FIG. 10 shows a functional block configuration of a camera (camera 200).

The camera 200 is provided with an optics system including a lens group 231, the image pickup device 1, a DSP circuit 232 that serves as a camera signal processing section, a frame memory 235, a display unit 233, a recording unit 236, an operational system 234, a power supply system 237, and the like. Among these component parts, the DSP circuit 232, the frame memory 235, the display unit 233, the recording unit 236, the operational system 234, and the power supply system 237 are configured to be interconnected with one another via a bus line 238.

The lens group 231 acquires incident light (image light) from a photographic subject to form an image on an imaging surface (light-receiving surface) of the image pickup device 1, and is configured of one or more lenses. The image pickup device 1 outputs image pickup data D0 on the basis of the incident light that is imaged on the imaging surface by the lens group 231. The display unit 233 may be configured of, for example, a liquid crystal display unit or an organic EL (Electroluminescence) display unit, and the like, and displays moving images or still images (color images for which image processing has been completed by an image processing section 22) that are photographed by the image pickup device 1. The recording unit 236 records the moving images or still images that are photographed by the image pickup device 1 on a recording medium, such as a video tape and a DVD (Digital Versatile Disk). The operational system 234 functions as an external signal input means in response to the user operation, and receives operational commands concerning various functions provided by the camera 200 to send these commands to internal circuits. The power supply system 237 includes various power supplies that serve as operation power supplies for the DSP circuit 232, the frame memory 235, the display unit 233, the recording unit 236, and the operational system 234.

The present disclosure is described thus far with reference to some embodiments and modification examples. However, the present disclosure is not limited to the above-described embodiments, and various modifications may be made. For example, in the above-described embodiments and the like, as an image sensor, a CMOS image sensor of a backside illumination type or a front-side illumination type is taken as an example. However, the image sensor is not limited to such a CMOS type, and a CCD (Charge-Coupled Device) image sensor, or a MOS image sensor may be also acceptable.

It is to be noted that the present technology is allowed to have the configurations described following (1) to (15).

(1) A method of manufacturing a semiconductor device, the method including:
bonding a device formation side of a first substrate having a first device and a device formation side of a second substrate having a second device in opposition to each other;
forming a protective film on at least an edge of the second substrate having the second device; and
reducing a thickness of the first substrate.

(2) The method according to (1), further including:
forming a thinned portion at an edge of the second substrate prior to bonding of the first substrate and the second substrate; and forming the protective film on a side surface of a device on the second substrate that is exposed by formation of the thinned portion and on a surface of the thinned portion.

(3) The method according to (1) or (2), further including: smoothing and cleaning a surface of the second substrate after forming the thinned portion on the second substrate.

(4) The method according to any one of (1) to (3), further including: forming a thinned portion at an edge of the first substrate; and reducing a thickness of a whole surface of the first substrate after removing the thinned portion.

(5) The method according to any one of (1) to (4), wherein the protective film is formed over a whole surface of the first substrate.

(6) The method according to any one of (1) to (5), wherein the protective film is formed of a material having chemical resistance.

(7) A method of manufacturing a semiconductor device, the method including:
forming a thinned portion at an edge of a first substrate having a first device;
forming a protective film that absorbs no laser beams on at least an edge of a second substrate having a second device;
bonding the first substrate and the second substrate with the first device and the second device opposed to each other; and
selectively removing the thinned portion of the first substrate using a laser.

(8) The method according to (7), further including: reducing a thickness of a whole surface of the first substrate after removing the thinned portion of the first substrate.

(9) The method according to (7) or (8), further including: using a laser microjet to remove the thinned portion of the first substrate.

(10) The method according to any one of (7) to (9), further including: forming the protective film over a whole surface of the second substrate prior to bonding of the first substrate and the second substrate.

(11) A method of manufacturing a semiconductor device, the method including:
bonding a first substrate having a first device and a second substrate having a second device with the first device and the second device opposed to each other;
reducing a thickness of an internal region excluding an edge of the first substrate; and
removing the edge of the first substrate.

(12) The method according to (11), further including: forming a protective film at an edge of the second substrate after bonding of the first substrate and the second substrate.

(13) The method according to (11) or (12), further including: bonding the first substrate and the second substrate after forming a protective film over a whole surface of the second substrate.

(14) The method according to any one of (11) to (13), further including: reducing a thickness of an internal region of the first substrate using a mechanical grinding process.

(15) The method according to any one of (11) to (14), further including: reducing a thickness of an internal region of the first substrate using a chemical treatment.

This application claims the priority on the basis of Japanese Patent Application No. 2012-007086, No. 2012-007087, and No. 2012-007088 filed on Jan. 17, 2012 in Japan Patent Office, the entire contents of which are incorporated in this application by reference.

Those skilled in the art could assume various modifications, combinations, subcombinations, and changes in accordance with design requirements and other contributing factors. However, it is understood that they are included within a scope of the attached claims or the equivalents thereof.

The invention claimed is:

1. A method of manufacturing an image sensor device, the method comprising:
providing a first substrate having thereon a first device layer and a second substrate having thereon a second device layer, the first device layer containing pixel circuitry for converting light into image signals, the second device layer containing circuitry for processing the image signals, the first substrate being wider than the first device layer in cross section so as to have an edge portion extending beyond an edge of the first device layer;
bonding the first and second device layers to each other;
forming a protective film on at least an edge of the second substrate; and
forming a first thinned portion of the first substrate by reducing a thickness of the first substrate at the edge portion.

2. The method according to claim 1, further comprising:
forming a second thinned portion at an edge of the second substrate prior to bonding of the first device layer and the second device layer; and forming the protective film on a side surface of an electronic device on the second substrate that is exposed by formation of the second thinned portion and on a surface of the second thinned portion.

3. The method according to claim 2, further comprising: smoothing and cleaning a surface of the second substrate after forming the second thinned portion on the second substrate.

4. The method according to claim 1, further comprising:
removing the first thinned portion; and
reducing a thickness of a whole surface of the first substrate after removing the first thinned portion.

5. The method according to claim 1, wherein the protective film is formed over a whole surface of the first substrate.

6. The method according to claim 1, wherein the protective film is formed of a material having chemical resistance.

7. A method of manufacturing an image sensor, the method comprising:
providing a first substrate having thereon a first device layer and a second substrate having thereon a second device layer, the first device layer containing pixel circuitry for converting light into image signals, the second device layer containing circuitry for processing the image signals, the first substrate being wider than the first device layer in cross section so as to have an edge portion extending beyond an edge of the first device layer;
forming a thinned portion at the edge portion of the first substrate;

forming a protective film that absorbs no laser beams on at least an edge of the second substrate;

bonding together the first substrate and the second substrate with the pixel circuitry and the logic circuitry opposed to each other; and selectively removing the edge portion of the first substrate using a laser.

8. The method according to claim 7, further comprising: reducing a thickness of a whole surface of the first substrate after removing the edge portion of the first substrate.

9. The method according to claim 7, further comprising: using a laser microjet to remove the edge portion of the first substrate.

10. The method according to claim 7, further comprising: forming the protective film over a whole surface of the second substrate prior to bonding of the first substrate and the second substrate.

11. A method of manufacturing an image sensor, the method comprising:

providing a first substrate having thereon a first device layer and a second substrate having thereon a second device layer, the first device layer containing pixel circuitry for converting light into image signals, the second device layer containing circuitry for processing the image signals, the first substrate being wider than the first device layer in cross section so as to have an edge portion extending beyond an edge of the first device layer;

bonding together the first and second device layers with the pixel circuitry and the logic circuitry opposed to each other;

reducing a thickness of an internal region excluding the edge portion of the first substrate; and removing the edge portion of the first substrate.

12. The method according to claim 11, further comprising: forming a protective film at an edge of the second substrate after bonding of the first and second device layers.

13. The method according to claim 11, further comprising: bonding the first substrate and the second substrate after forming a protective film over a whole surface of the second substrate.

14. The method according to claim 11, further comprising: reducing a thickness of an internal region of the first substrate using a mechanical grinding process.

15. The method according to claim 11, further comprising: reducing a thickness of an internal region of the first substrate using a chemical treatment.

* * * * *